United States Patent [19]

Takahashi

[11] Patent Number: 5,285,119
[45] Date of Patent: Feb. 8, 1994

[54] SEMICONDUCTOR INTEGRATED TRI-STATE CIRCUITRY WITH TEST MEANS

[75] Inventor: Toshiro Takahashi, Ohme, Japan
[73] Assignee: Hitachi, Ltd., Tokyo, Japan
[21] Appl. No.: 867,475
[22] Filed: Apr. 13, 1992
[30] Foreign Application Priority Data
  Apr. 24, 1991 [JP] Japan .................. 3-119080
[51] Int. Cl.$^5$ ............................. H03K 19/00
[52] U.S. Cl. .................. 307/473; 371/22.1; 324/158 R
[58] Field of Search ............ 307/473, 443; 371/22.1, 371/25.1; 324/158 R

[56] References Cited

U.S. PATENT DOCUMENTS

| | | | |
|---|---|---|---|
| 4,608,504 | 9/1986 | Yamamoto | 307/473 |
| 4,866,309 | 9/1989 | Bonke et al. | 307/473 |
| 5,136,185 | 9/1992 | Fleming et al. | 307/473 |
| 5,159,273 | 10/1992 | Wright et al. | 371/22.1 |
| 5,166,937 | 11/1992 | Blecha, Jr. | 371/22.1 |

OTHER PUBLICATIONS

Nikkei Electronics, "Scan-Bus Structure Used in Automatic Design for Testability", pp. 308–311, No. 400, Jul. 28, 1986, Nikkei McGraw-Hill (with translation).

Primary Examiner—Edward P. Westin
Assistant Examiner—Andrew Sanders
Attorney, Agent, or Firm—Fay, Sharpe, Beall, Fagan, Minnich & McKee

[57] ABSTRACT

A plurality of tristate circuits (TSG1, TSG2, TSG3) each include an input circuit (NAND1, NOR1; NAND2, NOR2; NAN3, NOR3) for receiving first and second control signals (φgoe1*, in1; φgoe2*, in2; φgoe3*, in3) and a tristate output circuit (Q1p, Q1n; Q2p, Q2n; Q3n). The input circuits further receiving a test signal (TEST*). The tristate circuits each include a tristate output (OT1; OT2; OT3) which connects the output circuit to a signal line (SL). The signal line is connected with a test output circuit (Ru, Q4p, Q4n, Rd). The tristate output circuits each include a MOSFET (Q1p; Q2p; Q3p) for selectively connecting the tristate output (OT1; OT2; OT3) with a power supply terminal (Vdd) and a MOSFET (Q1n; Q2n; Q3N) for connecting the tristate output with a ground voltage level (Vss). In one test mode, a test signal is applied (i) which causes the MOSFETs (Q1p; Q2p; Q3p) to cut off forcibly cutting the current path between the power supply terminal (Vdd) and the signal line (SL) and (ii) causes the test output circuit pull-up transistor (Q4p) to close connecting a pull up resistance (Ru) between the power supply voltage level (Vdd) and the signal line (SL). In this mode, the voltage level of the signal line is set to a logic 1 or a logic 0. In this manner, the operation is equivalent to a selector for forcing the signal line to the voltage level of a logic 1 or a logic 0.

9 Claims, 8 Drawing Sheets

SEMICONDUCTOR INTEGRATED TRI-STATE CIRCUITRY WITH TEST MEANS

BACKGROUND OF THE INVENTION

The present invention relates to a semiconductor integrated circuit including a tristate output circuit such as a tristate gate, and moreover to diagnosis technique for such circuit, namely to a technology which is effective, for example, when applied to a gate array type semiconductor integrated circuits and ASIC (Application Specific Integrated Circuit) type microcomputer.

As a diagnosis technology for a semiconductor integrated circuit such as a microcomputer which is further increasing the scale of logic circuits, a scan bus system has been proposed. In this case, a test data input/output mode are provided for a semiconductor integrated circuit, in addition to the ordinary operation mode in order to enable effective diagnosis of many logic gates through external terminals and thereby a structure for easily inputting and outputting test data to internal registers is previously provided for the semiconductor integrated circuit. For instance, the scan bus is structured by adding the function as the shift register to each flip-flop within the semiconductor integrated circuit or the scan bus which inputs or outputs data to or from the predetermined group of the flip-flops by assigning the addresses to the flip-flops. In such scan bus structures, the test of complicated sequential circuits is concluded to the test for the combined circuit. Here, a fault in which the predetermined node is fixed to logic 0 or logic 1 is assumed, and a test pattern which enables detection of assumed faults of all nodes with the predetermined fault detecting rate is given to the semiconductor integrated circuit and a fault may be found by comparing the output pattern at this time with an expected value pattern.

As an example, the scan bus system has been described in the "NIKKEI ELECTRONICS" (P.308 to P.311, No. 400, issued on Jul. 28, 1986, NIKKEI McGraw-Hill).

SUMMARY OF THE INVENTION

The inventors of the present invention have proved that a fault detection rate for the logic of gate output enable signal of the relevant gate is remarkably lowered in case a tristate gate is included since a high output impedance of particular node cannot be detected in the test to be executed by assuming a fault where the predetermined node is fixed to the logic 0 or logic 1 in the conventional scan bus structure, because the relevant tristate gate takes three values outputs, namely the logic 1, logic 0 and high output impedance in such a case that a selector logic is formed by employing the tristate gate in the semiconductor integrated circuit.

Figure 11:
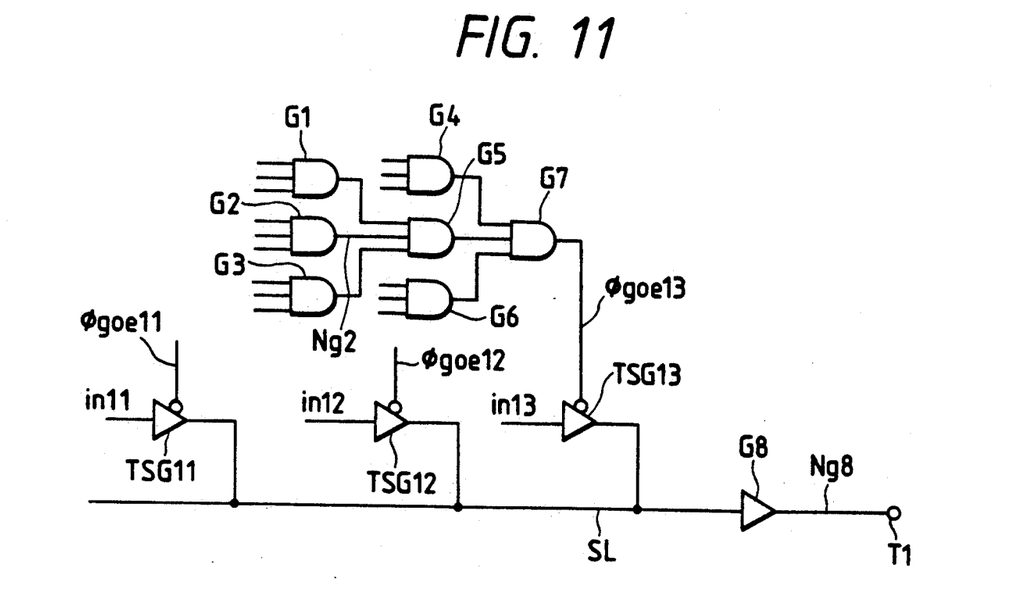
FIG. 11 is a diagram for explaining an ordinary structure utilizing a tristate gate.

For example, the logic obtained when the output terminals of three tristate gates TSG11 to TSG13 are connected in common to the signal line SL as shown in FIG. 11 is assumed here. $\phi$goe11 to $\phi$goe13 denote gate output enable signals to be supplied to the tristate gates TSG11 to TSG13; in11 to in13, input signal of tristate gates TSG11 to TSG13. In this structure, for example, when $\phi$goe11=logic 1, $\phi$goe12=logic 0 and $\phi$goe13=logic 1, outputs of the tristate gates TSG11, TSG13 are set to a high impedance state and thereby output operation of the tristate gate TSG12 is selected and the signal in12 is applied to the signal line SL.

The gate output enable signals $\phi$goe11 to $\phi$goe13 are formed by various logics and the logic gates G1 to G7 like the AND gate is an example of the logic circuit to form the gate output enable signal $\phi$goe13. In this logic, for example, it is assumed that this logic is fixed to the logic 0 due to a fault of transistor forming the gate G2 or disconnection of signal line for transferring the output signal of gate G2. For instance, when all inputs of gates G1 to G4, G6 are set to logic 1, the gate output enable signal $\phi$goe13 takes logic 0 because of the relevant fault and also takes logic 1 if any fault is not found in the node Ng2. In this case, since the gate output enable signal $\phi$goe13 cannot be observed in direct from the outside of semiconductor integrated circuit, it must be observed from the node Ng8 (external terminal T1) through the gate G8. However, a high output impedance state of the tristate gate TSG13 cannot be observed from the outside. For example, when $\phi$goe11=logic 1; $\phi$goe12=logic 1, in13=logic 1, if a fault occurs in the node Ng2, the $\phi$goe13=logic 0, therefore the tristate gate TSG13 turns ON and the node NG8 becomes logic 1, depending on the logic level of the signal in13. Meanwhile, when a fault is not found in the node Ng2, an output of the tristate gate TSG13 becomes high impedance, but logic level of node Ng8 takes logic 0 or logic 1 depending on the discharging condition of the signal SL which is determined in accordance with the preceding circuit operation. If it eventually takes logic 1, it cannot be discriminated from the fault condition.

In case the circuit structure of FIG. 11 is included in the CMOS (complementary MOS) type semiconductor integrated circuit, for measurement of a standby current of the semiconductor integrated circuit, any one of the tristate gates TSG11 to TSG13 using in common the signal line SL is set to the operable condition so that an input of the gate G8 does not become uncertain intermediate level and moreover it is also required that a current cannot flow into the other tristate gate from the one tristate gate and troublesome procedures are required to generate a particular operation pattern for satisfying such requirement for all logic gates.

Figure 12:
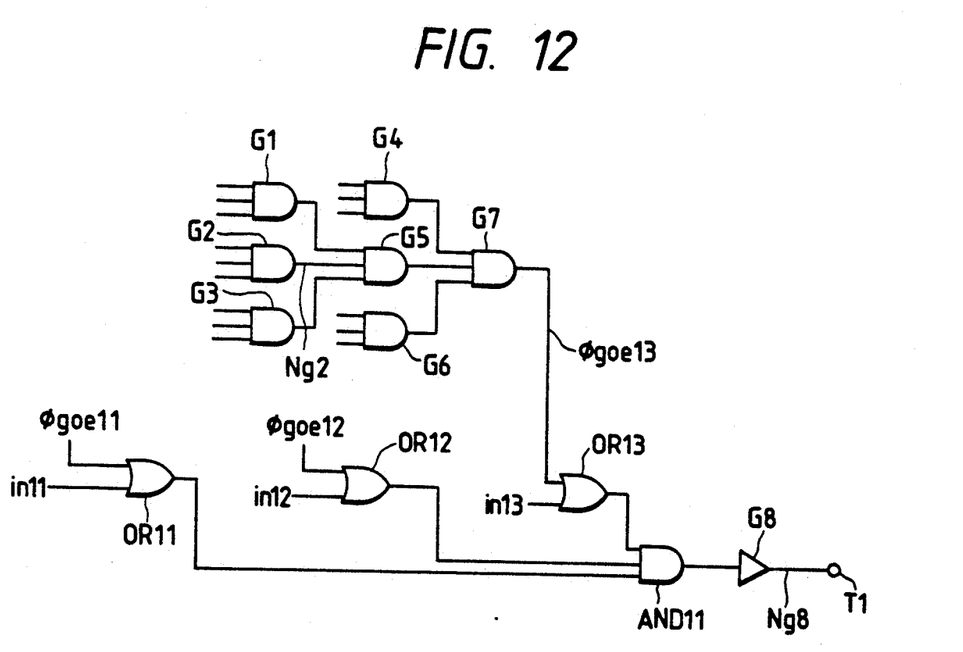
FIG. 12 is a diagram for explaining a selector circuit of the OR-AND structure equivalent to FIG. 11 proposed by the inventor of the present invention.

Therefore, the inventors of the present invention have discussed a structure for replacing a tristate gate into a selector circuit. For instance, the tristate gates TSG11 to TSG13 shown in FIG. 11 may be replaced with a selector circuit having the OR gates OR11 to OR13 and AND gate AND11 as shown in FIG. 12. In the structure of FIG. 12, for example, when $\phi$goe=-logic 1; $\phi$goe12=logic 0 and $\phi$goe13=logic 1, the input in12 of the OR gate OR12 is selected and the signal of the same logic as the signal in12 is outputted from the gate G8. In this logic, a fault for the logic of the signal $\phi$goe13 formed by the gates G1 to G7 can be reliably detected. For example, it is assumed here that the output node NG2 of gate G2 is fixed to the logic 0 by a fault, the gate output enable signal $\phi$goe13 takes logic 0 or takes logic 1 when any fault is not generated in the node Ng2 by setting all inputs of the gates G1 to G4, G6 to logic 1. In this case, when $\phi$goe11=logic 1, $\phi$goe12=logic 1, in13=logic 0, if logic 0 fault is detected in the node Ng2, $\phi$goe13=logic 0 and the node Ng8 is set to logic 0 depending on the logic level of the signal $\phi$goe13. Meanwhile, when a fault is not detected in the node Ng2, the logic level of the node Ng8 is set to logic 1 depending on the $\phi$goe13=logic 1.

By employing the selector having the OR gates 11 to 13 and AND gate 11 of FIG. 12 in place of the tristate gates TSG11 to TSG13 of FIG. 11, the test can sufficiently be made for the fault of logics generated by the control signals φgoe11, φgoe12 and φgoe13. However, the inventors of the present invention have also proved that in the case of employing the selector of FIG. 12 in place of the tristate gates, the selector must always be used even for ordinary operation of the semiconductor integrated circuit, thereby the number of stages of gates existing in the signal transmission routes increases and operation delay becomes large, giving some influences on the ordinary operation.

It is therefore an object of the present invention to provide a semiconductor integrated circuit which can enhance reliability or fault detection rate of function test for the control signal forming logic of the tristate output circuit.

It is another object of the present invention to provide a semiconductor integrated circuit which can enhance reliability of function test for control signal forming logic of the tristate output circuit without lowering ordinary operation rate.

It is further object of the present invention to provide a semiconductor integrated circuit which easily enables observation of standby current.

These and other objects and novel features of the present invention will become apparent from the following description of the specification with reference to the accompanying drawings.

Typical invention among those disclosed in this specification will be summarized as follow.

Namely, in a semiconductor integrated circuit including a plurality of tristate output circuits which can take a high output impedance state depending on the logic level of the first control signal such as a gate output enable signal and are connected in common to the predetermined signal lines at the output terminals, the tristate output circuit mentioned above is provided with a first means which is capable of forming the first current path for connecting any one predetermined power supply terminal to the predetermined signal line in the forcible cut-off condition of the output current path, including a transistor which forcibly shuts the output current path extending to the output terminal from the one predetermined power supply terminal depending on the predetermined level of the second control signal just like the test signal to be inputted thereto.

In the case of considering measurement of a standby current, it is desirable to selectively achieve the condition that a current does not flow into the predetermined signal line, without relation to the operating mode of the tristate output circuit For this purpose, it is recommended that the first means includes a first switch element to selectively form a first current path and also a second means to form a second current path which may be connected to the predetermined signal line from the other power supply terminal. This second means is also preferably connected with a second switch element which is complementarily switchcontrolled by the first switch element under the forcible cut-off condition of the current path for output.

It is desirable for reducing the number of external control signals for synchronously executing the controls of the first switch element and the second switch element, together with the cut-off control of output current path to further provide the logic for complementary switch control by the second control signal and third control signal for the first switch element and the second switch element under the cut-off condition of the output current path by means of the second control signal.

The present invention will be explained from the other point of view, by placing emphasis on the input condition for determining output logic values of the tristate output circuit. As a first profile, the tristate output circuit has the logic which forcibly sets an output of the tristate output circuit to high output impedance condition with the predetermined level of the second control signal and the transistor under the input condition for determining the output of the first control signal and input signal to logic 1 and provides a pullup resistance which is connected to the predetermined signal line under the forcible output condition by the second control signal. A plurality of tristate output circuits, predetermined signal line and pullup resistance are caused to function equivalently as the selector circuit having the OR-AND circuit structure at the predetermined level of the second control signal.

As the second profile placing emphasis on the input condition, the tristate output circuit has the logic for forcibly setting output of the tristate output circuit to a high impedance condition with the predetermined second control signal and the transistor under the input condition for determining the outputs of the first control signal and input signal to logic 0 and also provides the pulldown resistance to be connected to the predetermined signal line under the forcible output condition by the second control signal. A plurality of tristate output circuits, predetermined signal line and pulldown resistance are caused to equivalently function as the selector circuit of the AND-OR structure by the predetermined level of the second control signal.

According to the means explained above, a current is supplied from the power supply terminals in the cut-off condition through a first means including switch element and resistance element, under the forcible cut off condition of the output current path in the one power supply terminal side. Therefore, in the function test mode, the level of signal line to which outputs of the tristate output circuits are connected in common is set logic 1 or 0 even when the tristate output circuit takes any operation mode and the operation which is equivalent to the selector which can take binary outputs (logic 1, logic 0) is carried out. Thereby, the tristate output circuit which can take three output values does not generate a high output impedance in the function test mode and operates to enhance reliability of function test of the semiconductor integrated circuit including the tristate output circuit.

Moreover, under the condition that the output current path in the one power supply terminal side is forcibly cut off, the condition that a current is not allowed to flow into the signal line is forcibly attained by activating the second means connected to the power supply terminal side in place of the first means and thereby the signal line may be fixed to any one condition of the logic 1 or logic 0. When a standby current is measured under this condition, measurement of standby current with high reliability may be realized without allowing unwanted current to flow due to competition of output logic values of the tristate output circuit and unwanted through current resulting from an intermediate level of an input to the driver provided in the course of the signal line.

In case the tristate output circuit is operated in the ordinary mode to provide three-level outputs, the first and second means are separated from the signal line and the tristate output circuit realizes the selector function in the operate rate depending on the natural 3-level output operation logic.

BRIEF DESCRIPTION OF THE DRAWINGS

FIG. 6 is applied.

DESCRIPTION OF THE PREFERRED EMBODIMENTS

Figure 1:
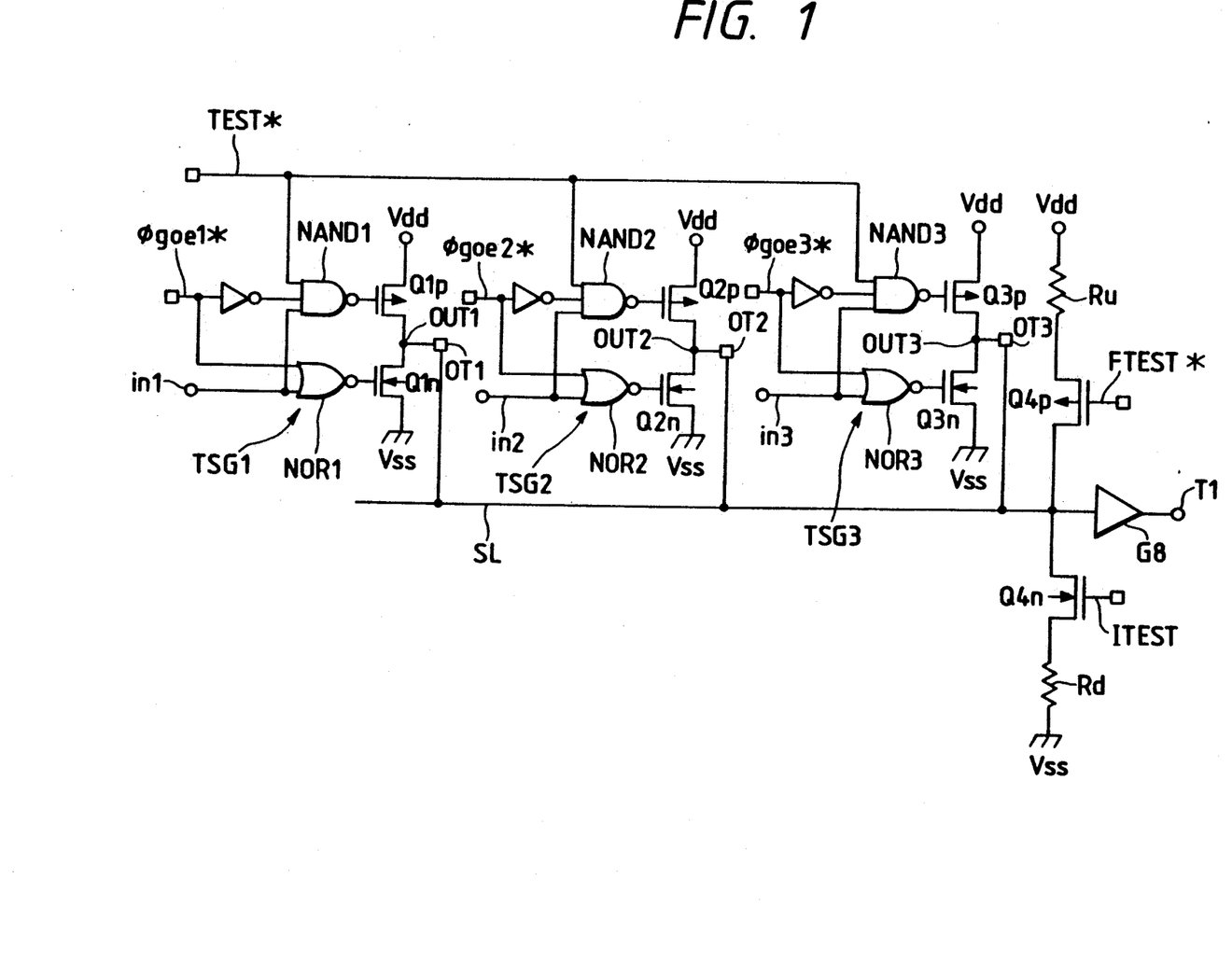
FIG. 1 is a block diagram of an embodiment of the present invention to which low enable tristate gate is applied.

FIG. 1 shows an embodiment of the present invention wherein the enable signal of the tristate output circuit (hereinafter referred only to as tristate gate) is set to the low enable. The circuit shown in the same figure is included in a semiconductor integrated circuit formed on only one semiconductor substrate like a silicon substrate and three tristate gates TSG1 to TSG3 of which output terminals are connected in common to the single signal line SL are typically indicated. The terminals indicated by the circles means the terminals observed from the outside of the semiconductor integrated circuit, namely the terminals connected to the pins for sending an electrical signal to the semiconductor integrated circuit within a package when the semiconductor integrated circuit is provided in the package, while the terminals indicated by the squares are terminals which cannot be observed from the outside of the semiconductor integrated circuit because these are not connected to the pins and are particularly provided within the semiconductor integrated circuit.

The tristate gate TSG1 has, although not limited particularly, a CMOS invertor, in the output stage, having the P channel MOSFETQ1p and N channel MOSFETQ1n connected in series between a pair of power supply terminals Vdd and Vss, and also has a NAND gate NAND1, NOR gate NOR1 and invertor INV1 as the logics for controlling the same output stage. To the power supply terminal Vdd, for example, a high level (hereinafter referred only as "H" level) power supply voltage 5 V is supplied, while to the power supply terminal Vss, a low level (hereinafter referred only as "L" level) ground potential 0 V is supplied. To the NAND gate NAND1, a test signal TEST* (the signal given the mark * means it is a low enable signal) as the control signal which is set to the low level in the test mode, an inverted signal of the control signal $\phi$goe1* as the control signal which is used as the output enable signal of the tristate gate and an input signal in1 are supplied and its output is then supplied to the gate of MOSFETQ1p. To the NOR gate NOR1, the control signal $\phi$goe1* and the input signal (considered as the test signal in the test mode) in1 are supplied and its output is supplied to the gate of the MOSFETQ1n. The other tristate gates TSG2, TSG3 are also structured in the same manner. Namely, the tristate gate TSG2 is formed by the P channel MOSFETQ2p, N channel MOSFETQ2n, NAND gate, NAND2, NOR gate NOR2 and invertor INV2 and the test signal TEST*, control signal $\phi$goe2* and input signal in2 are given. The tristate gate TST3 is formed by the P channel MOSFETQ3p, N channel MOSFETQ3n, NAND gate NAND3, NOR gate NOR3 and invertor INV3 and the test TEST*, control signal $\phi$goe3* and input signal in3 are applied thereto. The output stages MOSFETQ1p to Q3p of the tristate gates TSG1 to TSG3 are separated electrically from the power supply terminal Vdd when the test signal TEST* is set to the low level.

The outputs OUT1 to OUT3 of the tristate gates TSG1 to TSG3 are connected in common to the predetermined signal line SL. To the signal line SL, a pull-up resistance Ru which is used in the test mode is coupled with the power supply terminal Vdd through the P channel MOSFETQ4p and the pull down resistance Rd is coupled with the power supply terminal Vss (ground terminal) through the N channel MOSFETQ4n. The MOSFETQ4p is turned ON in the function mode instructed when the function test signal TEST* becomes low level and a current path (first current path in this embodiment) connected to the signal line SL from the power supply terminal Vdd through resistance Ru is formed. The MOSFETQ4n is turned ON in the standby current test mode instructed when the standby current test signal ITEST becomes high level and a current path (second current path in this embodiment) connected to the signal line SL from the power supply Vss through the resistance Rd is formed.

Here, the operation mode of the semiconductor integrated circuit of this embodiment is roughly classified into the ordinary operation mode which is the intrinsical operation mode of the semiconductor integrated circuit and the test mode. The test mode includes the function test mode and standby current test mode.

The function test is executed for choking the logic function of a semiconductor integrated circuit. For instance, when a predetermined signal is inputted to a logic circuit having the predetermined logic function, the signal to be outputted is set as an expectation value. When the predetermined signal is inputted, actual output signal is compared with the preset expectation value. When these are matched, it means the logic circuit operates normally. If these are not matched, it means the logic circuit does not operate normally. If the signal lines short-circuited or a transistor breaks down (includes defective portion), unwanted leak current is generated within a semiconductor integrated circuit. The standby current test is conducted for finding such defective portion. In the standby current test, each circuit element of the semiconductor integrated circuit is set to the non-operatble condition. Each circuit element means, for example, a current sense amplifier and a flip-flop and these circuit elements are forcibly non-operated by the clock signal for operation.

The function test mode is instructed by the low level of the test signal TEST* and function test signal FTEST*. The standby current test mode is instructed by the low level of the test signal TEST* and the high level of the standby current test signal ITEST.

In the table 1, the operation profiles of the tristate gates are indicated representing the operation of the tristate gate TSG1.

In the ordinary mode instructed by the high level (H) of the test signal TEST*, when the control signal φgoe1* is set to the high level, the tristate gate φgoe1* is set to the high output impedance condition (Hiz). When the control signal φgoe1* is set to the low level (L) in the ordinary mode, the tristate gate TSG1 can output the signal depending on the level of the input signal in1.

TABLE 1

| TEST* | in1 | φgoe1 | OUT1 |
|---|---|---|---|
| (Ordinary mode) | H | L | H |
| | L | | L |
| H | H | H | Hiz |
| | L | | |
| (Test mode) | H | L | Hiz |
| L | L | | L |
| | H | H | Hiz |
| | L | | |

In the test mode (function test mode, standby current test mode) instructed by the low level of test signal TEST*, since an output of the NAND gate NAND1 which controls the gate potential of the P channel MOSFETQ1p for output is fixed to the high level (logic 1 in this embodiment), the MOSFETQ1p is always turned OFF, cutting off the output current path extending to the output terminal OT1 from the power supply terminal Vdd. Accordingly, only when both input signal in1 and control signal φgoe1* are low level (logic 0), the N channel MOSFETQ1n for output is turned ON, setting the output signal OUT1 to the low level and setting the output OUT1 to a high output impedance condition in the other input conditions.

Figure 2:
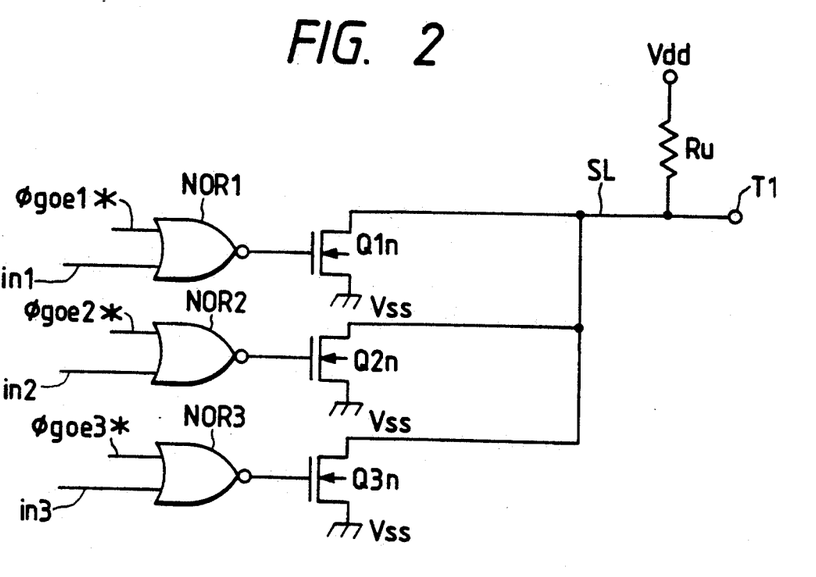
FIG. 2 is an equivalent circuit diagram in the function test mode of FIG. 1.
Figure 3:
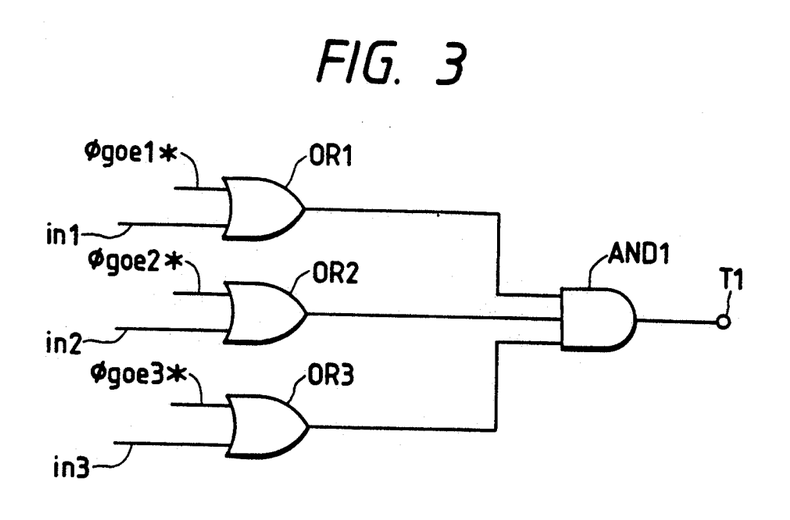
FIG. 3 is a selector circuit diagram which is equivalent to FIG. 2.

FIG. 2 shows an equivalent circuit when the function mode is set in FIG. 1. In the relevant operation mode, both test signal TEST* and function test signal FTEST* are set to the low level, the signal line SL is pulled up by the resistance Ru and condition of the signal line SL is determined only by the outputs of the NOR gates NOR1 to NOR3. Therefore, when all outputs OUT1 to OUT3 of the tristate gates TSG1 to TSG3 are set to the high impedance condition in the function test mode, in other words, when all MOSFETQ1n to Q3n are turned OFF, the signal line SL is set to the high level by the effect of the pullup resistance Ru and when any one of the outputs of tristate gate is set to the low level, the level of signal line SL is set to the low level. Namely, the circuit of FIG. 2 has the function which is equivalent to the selector of OR-AND structure having the OR gates OR1 to R3 and the AND gate AND1 shown in FIG. 3. Thereby, the level of the signal line SL is fixed any one of the logic 1 or logic 0, in the function test mode, without relation to the logic levels of the control signal φgoe1* to φgoe3* and the input signals in1 to in3. As a result, since a high impedance condition of the tristate gate which cannot be detected in the function test can be suppressed, reliability of function test can be enhanced. In the function test, a considerable time is required for raising the level of the signal line SL to the high level with a pullup resistance Ru, but such problem does not occur in the actual operation mode because the pullup resistance Ru is used only for the test.

Figure 4:
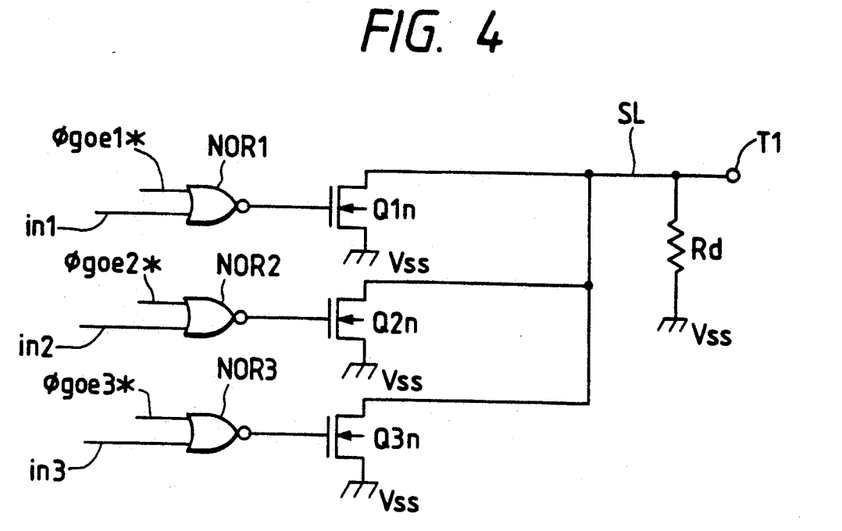
FIG. 4 is an equivalent circuit diagram of FIG. 1 in the standby current test mode.

In the standby current test mode, the test signal TEST* is set to the low level and the standby current test signal ITEST is set to the high level. Thereby, as shown in the equivalent circuit of FIG. 4, the pull-down resistance Rd is connected to the signal line SL in the circuit of FIG. 1 and this signal line SL is fixed to the low level. Namely, the paths on which the current flows to the signal line SL from the power supply terminal Vdd are all forcibly cut off without relation to output condition of the, NOR gates NOR1 to NOR3. In other words, in this operation mode, outputs of the tristate gates TSG1 to TSG3 are never set to the high level. Accordingly, it does not occur that an input of a driver or gate G8 connected to the signal line SL becomes an intermediate level and a through current flow and a current flows to the other tristate gate from the one tristate gate having different output logic value. Therefore, since the condition wherein any current does not flow (non-operatable condition) may be established depending on the conditions of input signal and control signal, measurement of standby current, such as measurement of current which flows due to a fault of device can be executed easily and reliably only by setting the standby current test mode, without applying a particular test pattern.

Figure 5:
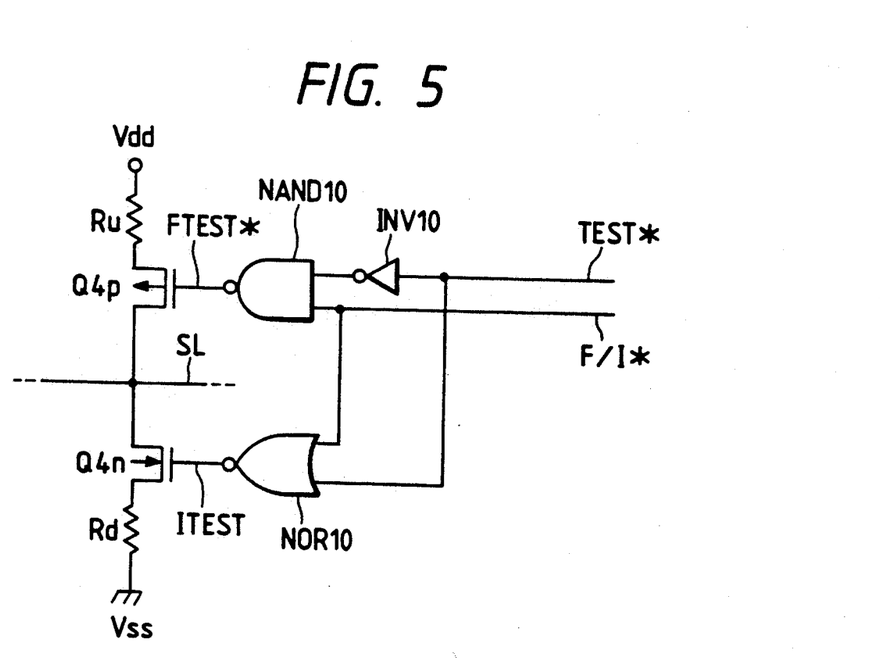
FIG. 5 is an example of circuit diagram of control logics for pullup and pull-down of the signal line depending on the function test mode or standby current test mode.

FIG. 5 shows an example of a logic for generating the function test signal TEST* and the standby current test signal ITEST. This logic is formed by a HAND gate NAND10, a NOR gate NOR10 and an invertor INV10. In the ordinary operation mode where the test signal TEST* i set to the high level, the function test signal FTEST* is set to the high level and the standby current test signal ITEST is set to the low level to control both MOSFETQ40, Q4n to the cut-off condition. In the test mode where the test signal TEST* is set to the low level, when the control signal F/I* is set to the high level, the pullup resistance Ru is connected to the signal line SL, establishing the function test mode. When the control signal F/I* is set to the low level, the pull-down resistance Rd is connected to the signal line SL, establishing the standby current test mode. From this logic, decrement of one external terminal in comparison with the case where the control signal FTEST* and ITEST are received in direct from external circuit can be realized.

Figure 6:
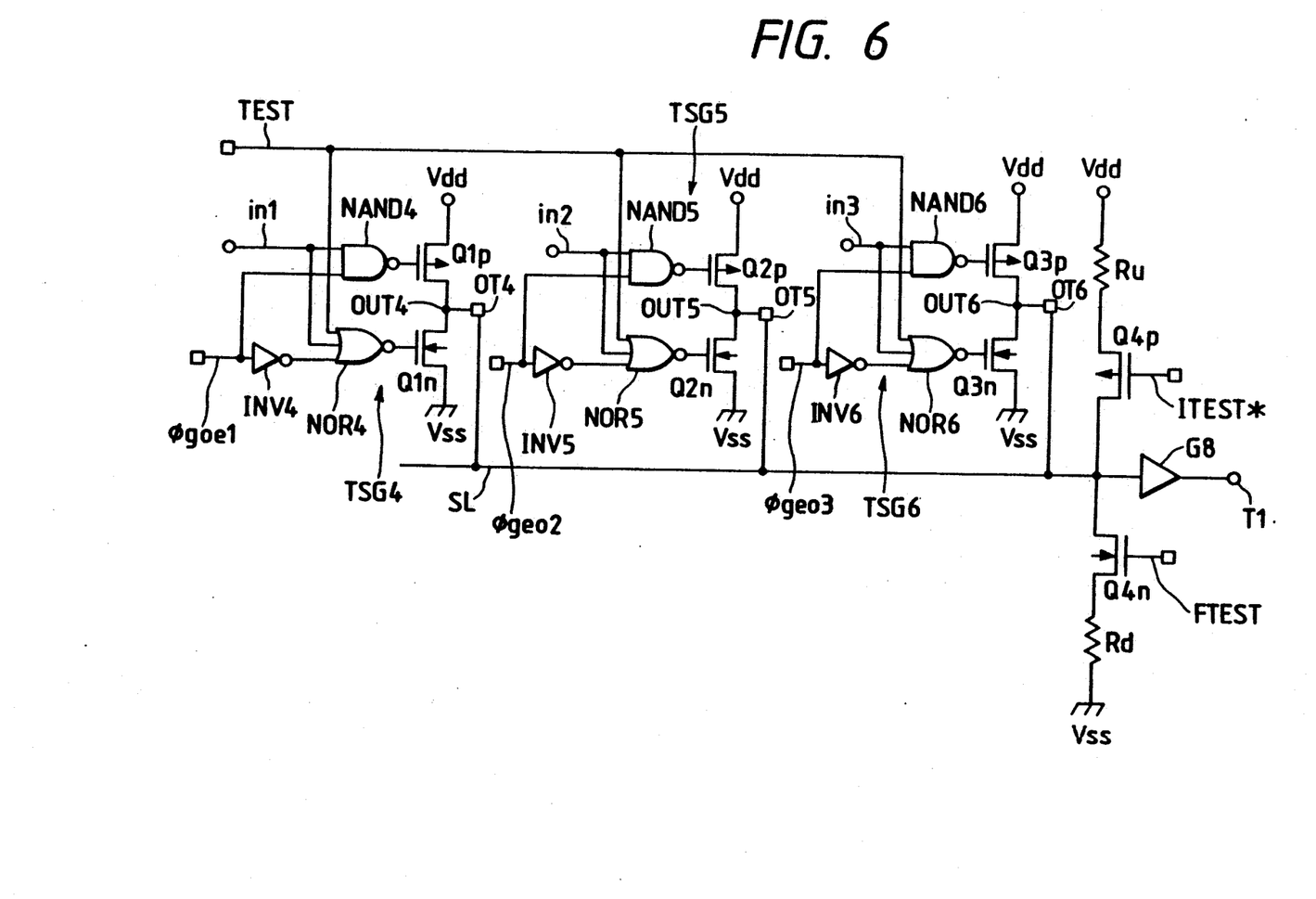
FIG. 6 is a block diagram of another embodiment of the present invention to which a high enable tristate gate is applied.

FIG. 6 shows an embodiment utilizing a tristate gate in which the enable level is set to the high level. In this figure, the terminals given the circles are terminals which may be observed from the outside of semiconductor integrated circuit, namely the terminals to be connected to the pins for transferring electrical signal to the semiconductor integrated circuit within the package when a semiconductor integrated circuit is stored within a package, while the terminals indicated by the square mark are terminals which cannot be observed from the outside of semiconductor circuit because these are not connected to the pins and therefore are particularly provided within the semiconductor integrated circuit. In this embodiment, three tristate output circuits TSG4 to TSG6 which are connected to the single signal line SL through the output terminal in common are indicated typically. In this embodiment, the N channel MOSFET for output of the tristate gates TSG4 to TSG6 is cut off in the test mode. Under this condition, the pull-down resistance Rd is connected to the signal line SL in the function test mode and moreover the pull-up resistance Ru is connected to the signal line SL in the standby current test mode.

Like the embodiment explained above, the tristate gate TSG4 has a CMOS invertor, at its output stage, having the P channel MOSFETQ1p and N channel MOSFETQ1n connected in series between a pair of power supply voltage Vdd and Vss and also provides a NAND gate NAND4, a NOR gate NOR4 and invertor INV4 in order to control the same output stage. To this NOR gate NOR4, the test signal TEST which is set to the high level during the test mode, an inversion signal of control signal φgoe1 as the control signal which is used as the output enable signal of the tristate gate and an input signal in1 are supplied and an output of this NOR gate NOR4 is then supplied to the gate of MOSFETQ1n. Meanwhile, the control signal φgoe1 and input signal in1 are supplied to the NAND gate NAND4 and its output is supplied to the gate of MOSFETQ1p. The other tristate gates TSG5, TSG6 are also formed in the same manner as explained above. Namely, the tristate gate TSG5 is formed by P channel MOSFETQ2p, N channel MOSFETQ2n, NAND gate NAND5, NOR gate NOR5 and invertor INV5 and receives the test signal TEST, control signal φgoe2 and input signal in2. The tristate gate TSG6 is formed by P channel MOSFETQ3p, N channel MOSFETQ3n, NAND gate NAND6, NOR gate NOR6 and invertor INV6 and receives the test signal TEST, control signal φgoe3, input signal in3. The output stages MOSFETQ1p to Q3p of the tristate gates TSG4 to TSG6 are electrically separated from the power supply terminal Vss when the test signal TEST is set to the high level.

The outputs OUT4 to OUT6 of the tristate gates TSG4 to TSG6 are connected in common to the predetermined signal line SL. In regard to the signal line s1, the pull-up resistance Ru to be used in the test mode is coupled with the power supply terminal Vdd through the P channel MOSFETQ4p, while the pull-down resistance Rd is coupled with the power supply terminal Vss through the N channel MOSFETQ4n. MOSFETQ4n is turned ON in the function test mode which is instructed by the high level of the function test signal TEST and forms a current path connected to the signal line SL from the power supply terminal Vss through the resistance Rd. On the other hand, MOSFETQ4p is turned ON in the standby current test mode instructed by the low level of the standby current test signal ITEST* and forms a current path connected to the signal line SL from the power supply terminal Vdd through the resistance Ru.

Here, the operation mode in this embodiment is roughly classified into the ordinary operation mode which is the intrinsic operation mode of the semiconductor integrated circuit and the test mode. The test mode includes the function test mode and standby current test mode. The function test mode is instructed when both test signal TEST and function test signal FTEST* are set to the high level. The standby current test mode is instructed when the test signal TEST is set to the high level and the standby current test signal ITEST* is set to the low level.

In the ordinary operation mode instructed by the low level of test signal TEST, when the control signal φgoe1 is set to the low level, the relevant tristate gate TSG4 is set to a high output impedance. When the control signal φgoe1 is set to the high level, the relevant tristate gate TSG4 outputs a signal depending on the level of the input signal in1.

In the test mode (function test mode, standby current test mode) instructed by the high level of test signal TEST, since output of the NOR gate NOR4 for controlling a gate potential of the N channel MOSFETQ1n for output is fixed to the low level, the MOSFETQ1n is always turned OFF, cutting off the output current path extending to the output terminal OT4 from the power supply terminal Vss. Accordingly, only when both input signal in1 and control signal φgoe1 are set to the high level, the P channel MOSFETQ1p for output is turned ON, setting the output signal OUT4 to the high level, or setting the output OUT1 to a high output impedance in the other input conditions.

Figure 7:
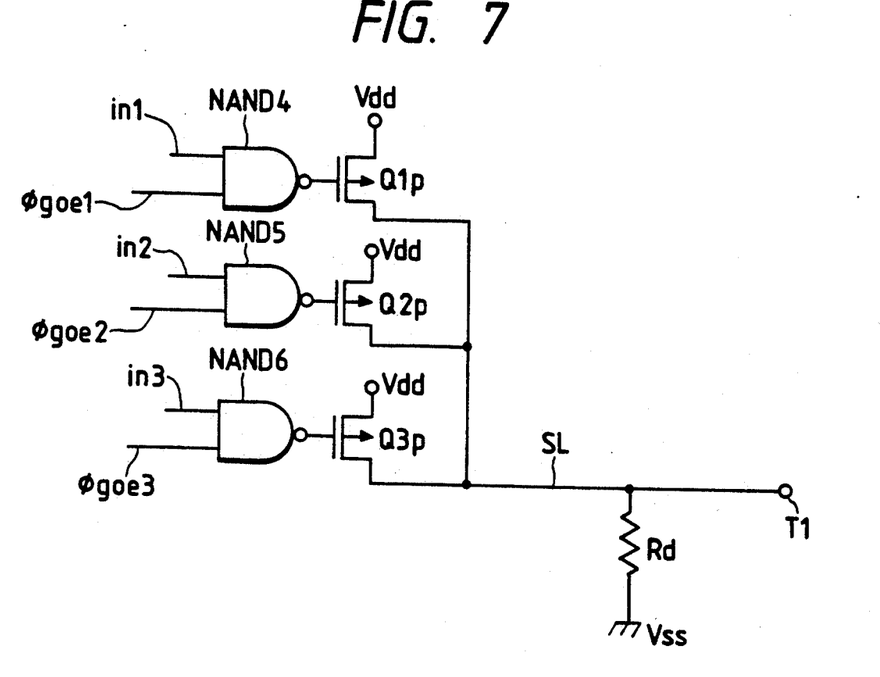
FIG. 7 is an equivalent circuit diagram in the function test mode.
Figure 8:
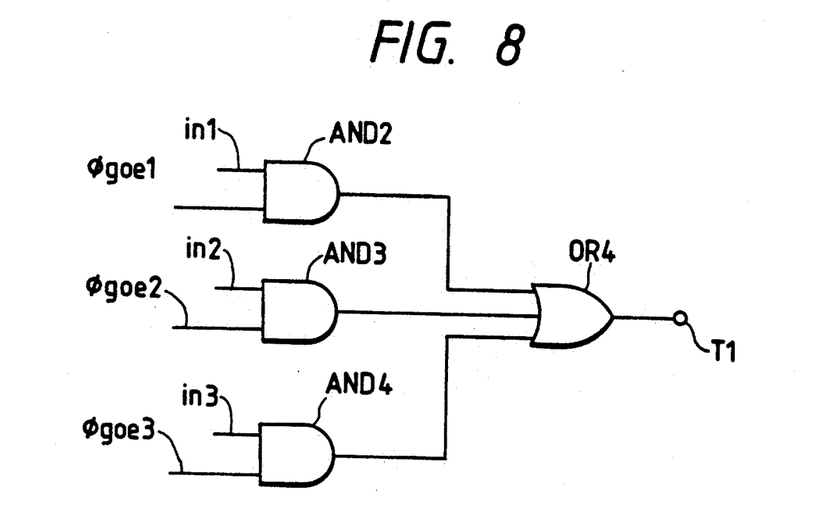
FIG. 8 is a selector circuit diagram equivalent to FIG. 7.

FIG. 7 shows an equivalent circuit in such a case that the function test mode is set in FIG. 6. In the relevant operation mode, the test signal TEST and function test signal FTEST are set to the high level, the signal line SL is pulled down by the resistance Rd and the condition of pulled down signal line SL is determined only by the output of the NAND gates NAND4 to NAND6. Therefore, the outputs OUT4 to OUT6 of the tristate gates TSG4 to TSG6 are all set to a high impedance in the function test mode, in other words, all MOSFETQ1p to Q3p are turned OFF, the signal line SL is set to the low level by the effect of the pull-down resistor Rd and when any one of the tristate gate is set to the high level, the level of signal line SL is set to the high level. Namely, the circuit of FIG. 7 has the function equivalent to the selector of AND-OR structure formed by the AND gates AND2 to AND4 and OR gate OR4 shown in FIG. 8. Thereby, the level of signal line SL is always fixed any one of the logic 1 or logic 0 in the function test mode, without relation to the logic levels of the control signals φgoe1 to φgoe3 and input signals in1 to in3. Accordingly, the high impedance condition of the tristate gates which may be difficult to be detected in the function test is no longer generated and reliability of function test can be enhanced. In the function test, considerable time is required for lowering the level of signal line SL with the pull-down resistance Rd, but since the pull-down resistance Rd is used only for test, such time never becomes a trouble in the actual operation mode.

In the standby current test mode, the test signal TEST is set to the high level and the standby current test signal ITEST* is set to the low level. Thereby, the pull-up resistance Ru is connected to the signal line SL to fix it to the high level. That is, the path on which a current flows to the power supply terminal Vss like the ground terminal from the signal line SL is forcibly cut off, without relation to the output condition of the NOR gates NOR4 to NOR6. In other words, outputs of the tristate gates TSG4 to TSG6 are never set to the low level. Thereby, it does not occur that inputs of the driver or gate G8 connected to the signal line SL becomes an intermediate level and a through current flows, moreover, it is never generated that a current flows into the other tristate gate from the one tristate gate having different output logic values. Accordingly, since it is possible to form the condition that any current does not flow, depending on the condition of input signal and control signal, measurement of standby current, such as a measurement of current flowing due to a fault of device, may easily and reliably be executed only by setting the standby current test mode without applying a particular test pattern.

Figure 9:
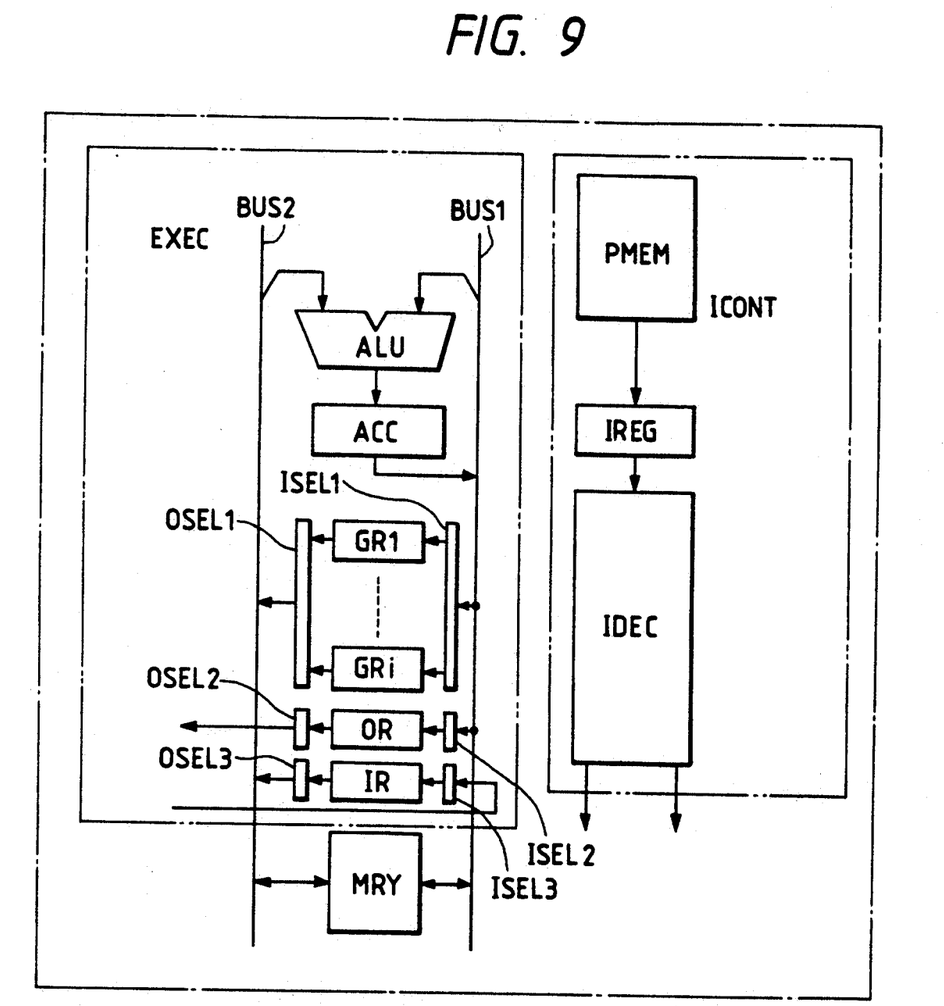
FIG. 9 is a block diagram of an example of a microcomputer to which the circuit of FIG. 1

FIG. 9 shows an example of a microcomputer to which a circuit shown in FIG. 1 or FIG. 6 is applied. This microcomputer is formed, for example on the one semiconductor chip such as a silicon chip by the well-known semiconductor manufacturing technique. This microcomputer comprises an instruction control circuit ICONT for decoding instructions to generate control signals, an executing circuit EXEC for executing instructions conforming to the control signals generated in the instruction control circuit ICONT and a memory MRY for storing data for calculation. The instruction control circuit ICONT generates, although not limited particularly, the control signals by the hard wired logic. This control circuit ICONT also comprises an instruction register IREG for fetching the instructions read from the program memory PMEM based on the values of program counters not illustrated. Thereby, the control circuit ICONT generates the control signals required for execution of the instructions by decoding the instruction codes held with the instruction decoder IDEC and supplies such control signals to the executing circuit EXEC.

The executing circuit EXEC comprises, although not limited thereto, an arithmetic calculation circuit, an accumulator ACC for temporarily holding the result of arithmetic calculation, a plurality of general purpose registers Ga1 to GRi, an output register OR, an input register IR, input selection circuits ISEL1 to ISEL3, and output selection circuits OSEL1 to OSEL3 connected to the internal buses BUS1, BUS2.

In FIG. 9, a circuit structure shown in FIG. 1 and FIG. 6 is applied as the input selection circuits ISEL1 to ISEL3 and output selection circuits OSEL1 to OSEL3. In the input selection circuits ISEL to ISEL3 and output selection circuits OSEL1 to OSEL3, the control signals corresponding to the gate output enable signals $\phi goe1*$ to $\phi goe3*$ are outputted from the instruction decoder IDEC or generated by such decoder. The terminals given the square marks shown in FIG. 1 and FIG. 6 are coupled with the adequate circuits in the microcomputer.

A semiconductor integrated circuit, for example, a microcomputer shown in FIG. 9, which is formed by a semicustom method just like ASIC or gate array must be formed depending on the logic design by users, even when it is partly formed. It is practically difficult, from the viewpoint of this property, to think that the tristate gate is never employed into the design circuit by users, and it can be thought inevitable for the test technique for the semiconductor integrated circuit to employ the circuit structure for test indicated in FIG. 1 and FIG. 6 in the semiconductor integrated circuit formed under such condition.

Figure 10:
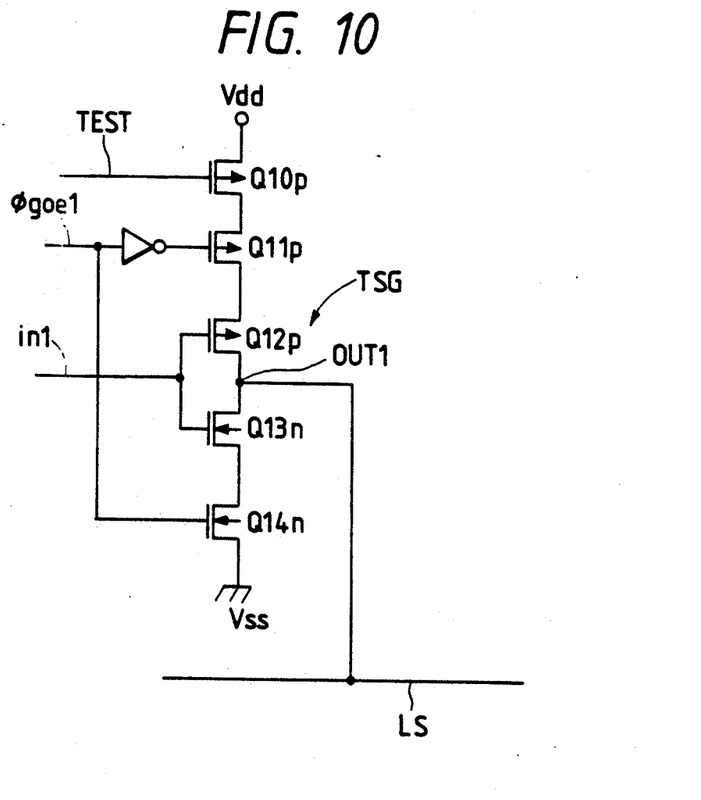
FIG. 10 is a circuit diagram illustrating another example of a tristate gate.

FIG. 10 shows another embodiment of the tristate gate. This tristate gate is provided with three P channel MOSFETQ10p to MOSFETQ12p and two N channel MOSFETQ13n to Q14n connected in series between a pair of power supply terminals Vdd and Vss. The input signal in1 is applied to the MOSFETQ12p, Q13n, while the control signal $\phi goe1$ to the MOSFETQ11p, Q14n and the test signal TEST to the MOSFETQ10p. In the test mode instructed by the h level of the test signal TEST, MOSFETQ10p is turned OFF, cutting off the current path for output connecting the output terminal OUT1 and power supply terminal Vdd. Therefore, this tristate gate may be replaced with the tristate gate shown in FIG. 6. In this case, the similar effect to that of the structure shown in FIG. 6 may be obtained, except for the point that the drivability is reduced in comparison with that of the tristate gate shown in FIG. 6.

While the invention has been particularly described with reference to a preferred embodiment thereof, it will be understood by those skilled in the art that the foregoing and other changes in form and details may be made therein without departing from the spirit and scope of the invention.

For example, the basic structure of the tristate gate is not limited only those shown in FIG. 1, FIG. 5 and FIG. 10. The output stage may be changed adequately to a circuit formed by the bipolar transistor and the control for output stage may also be realized by the circuit having the structure realized by the logic gates other than the NAND gate and NOR gate. Moreover, the signal line to which the outputs of tristate gates are connected in common is not limited to the signal wiring forming a bus in the CPU and it may be replaced with the signal line forming an intermodule bus for coupling the CPU and its peripheral circuits. Moreover, a semiconductor integrated circuit is not limited to the gate array format and application specific format.

In above description, the invention proposed by the present application has been applied to the microcomputer, but the application field of the present invention is not limited thereto and can also be applied to a wide range of the semiconductor integrated circuit. The present invention can be applied at least to the semiconductor integrated circuit having the condition which is effective to the function test, including the tristate output circuit The effects obtained by the typical inventions disclosed in this specification can be briefly explained hereunder.

Namely, in the function test mode instructed by the second control signal the level of the signal line to which output of the tristate output circuits are connected in common is set to logic 1 or logic 1, without relation to the operating mode of the tristate output circuit, realizing the operation equivalent to that of the selector which can take two level outputs. Therefore, the tristate output circuit which can take the 3-value outputs does not generate a high output impedance in the function test mode and results in the effect that the reliability of semiconductor integrated circuit including the tristate output circuit can be enhanced.

In the function test mode, a particular wiring path for alternate route of signal is not required for equalizing the function of the tristate output circuit to that of the selector circuit which can take the binary output, moreover the logic gate for only the test mode is not required. Therefore, the area occupied by the chip due to the circuit structure for test can be made very small.

Moreover, the present invention provides the effect that the condition that any current does not flow into the signal line can be forcibly attained, in the forcible cut-off condition of a current path for output in the side of the power supply terminal, by activating the second means connected to the side of power supply terminal in place of the first means, and it can be prevented by executing the measurement of standby current under this condition that unwanted current flows due to competition of output logic values of the tristate output circuit and an input of the driver provided in the course of the signal line becomes an intermediate level and unwanted through current flows, and the standby current can be easily measured only by setting the test mode without applying a particular test pattern.

In case the tristate output circuit is operated in the ordinary operation mode which can provide 3-value output, the first and second means are separated from the signal line and the tristate output circuit functions depending on the 3-output operation logic. Therefore, the effect mentioned above can be achieved without sacrificing the operation rate in the ordinary mode.

What is claimed is:

1. A semiconductor integrated circuit for testing, said semiconductor integrated circuit comprising:
    a first terminal to which a first voltage level is supplied; p1 a second terminal to which a second voltage level is supplied;
    output test means coupled to said first terminal and for outputting said first voltage level;
    a signal line which is coupled with said output means to receive said first voltage level; and
    a plurality of tristate circuits, each tristate circuit having (i) first and second control signal inputs which selectively receive corresponding first and second control signals, (ii) electrical connections to the first and second terminals, and (iii) a tristate circuit output connected with the signal line, each tristate circuit electrically couples one of said first and second terminals to the tristate output and the signal line in response to said first control signal, and each tristate circuit selectively couples the second voltage level to the tristate output and said signal line in response to said second control signal.

2. The semiconductor integrated circuit according to claim 1, wherein each tristate circuit includes an input circuit for receiving said first and second control signals and an output circuit which is coupled with said input circuit, said first and second terminals and said signal line.

3. The semiconductor integrated circuit according to claim 2, wherein said output circuit includes P type MOSFET and N type MOSFET, the one electrode of said P type MOSFET being coupled with said first terminal, the one electrode of said N type MOSFET being coupled with said second terminal, a signal being supplied to each gate electrode of said P type MOSFET and N type MOSFET from said input circuit, said signal line being coupled with the other electrodes of said P type MOSFET and N type MOSFET.

4. The semiconductor integrated circuit according to claim 3, wherein said first voltage level is a power supply voltage and said second voltage level is a ground potential.

5. The semiconductor integrated circuit according to claim 4, wherein said output means includes a switch means for receiving a control signal for test in order to check the logic functions to couple said first terminal to said signal line.

6. The semiconductor integrated circuit according to claim 4, wherein said output means includes a switch means for receiving a control signal for test in order to check a leak current to couple said first terminal to said signal line.

7. The semiconductor integrated circuit according to claim 3, wherein said first voltage level is a ground potential and said second voltage level is a power supply voltage.

8. The semiconductor integrated circuit according to claim 7, wherein said output means includes a switch means for receiving a control signal for test in order to check the logic functions to couple said first terminal to said signal line.

9. The semiconductor integrated circuit according to claim 7, wherein said output means includes a switch means for receiving a control signal for test in order to check a leak current to couple said first terminal to said signal line.

* * * * *